(12) United States Patent
Shim et al.

(10) Patent No.: US 10,516,135 B1
(45) Date of Patent: Dec. 24, 2019

(54) DISPLAY APPARATUS

(71) Applicant: SAMSUNG DISPLAY CO., LTD., Yongin-si, Gyeonggi-do (KR)

(72) Inventors: Hyunsub Shim, Yongin-si (KR); Taegon Kim, Yongin-si (KR); Sunyoul Lee, Yongin-si (KR); Heehwan Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/242,389

(22) Filed: Jan. 8, 2019

(30) Foreign Application Priority Data

Jul. 26, 2018 (KR) .................. 10-2018-0087274

(51) Int. Cl.
| | |
|---|---|
| *H01L 51/52* | (2006.01) |
| *H01L 27/32* | (2006.01) |
| *G09G 3/3266* | (2016.01) |
| *G09G 3/3233* | (2016.01) |
| *G09G 3/3258* | (2016.01) |

(52) U.S. Cl.
CPC ....... *H01L 51/5246* (2013.01); *G09G 3/3233* (2013.01); *G09G 3/3258* (2013.01); *G09G 3/3266* (2013.01); *H01L 27/3276* (2013.01); *G09G 2300/0426* (2013.01); *G09G 2300/0439* (2013.01)

(58) Field of Classification Search
CPC ............ H01L 51/5246; H01L 27/3276; G09G 3/3258; G09G 3/3233; G09G 3/3266; G09G 2300/0426; G09G 2300/0439; H05B 33/04
See application file for complete search history.

(56) References Cited

U.S. PATENT DOCUMENTS

| | | | |
|---|---|---|---|
| 6,530,916 B1 | 3/2003 | Shimmick | |
| 7,247,986 B2* | 7/2007 | Kang | ............... H01L 51/56 313/504 |
| 9,385,174 B2* | 7/2016 | Lee | ............... H01L 27/3276 |
| 9,583,730 B2* | 2/2017 | Jeon | ............... H01L 51/5246 |
| 2005/0184927 A1* | 8/2005 | Kwak | ............ H01L 27/3276 345/45 |

(Continued)

FOREIGN PATENT DOCUMENTS

| | | |
|---|---|---|
| KR | 2002-0065897 | 8/2002 |
| KR | 10-2006-0010442 | 2/2006 |

(Continued)

*Primary Examiner* — Joseph L Williams
*Assistant Examiner* — Jose M Diaz
(74) *Attorney, Agent, or Firm* — F. Chau & Associates, LLC

(57) ABSTRACT

A display apparatus includes a substrate that includes a display area and a peripheral area around the display area; an encapsulation substrate on the substrate; a sealing portion disposed in the peripheral area between the substrate and the encapsulation substrate, wherein the sealing portion surrounds the display area; and a pattern portion on the encapsulation substrate that overlaps the sealing portion while extending parallel to the sealing portion, where the pattern portion includes a plurality of block patterns that are spaced apart from one another and a plurality of opening regions that alternate with the plurality of block patterns, and a first block pattern of the plurality of block patterns that has a largest width is located at a center of the pattern portion.

20 Claims, 7 Drawing Sheets

(56) References Cited

U.S. PATENT DOCUMENTS

| | | | |
|---|---|---|---|
| 2011/0115365 A1 | 5/2011 | Kwak | |
| 2011/0215713 A1 | 9/2011 | Kang et al. | |
| 2012/0026074 A1* | 2/2012 | Lee | H01L 27/3276 345/76 |
| 2012/0319574 A1 | 12/2012 | Kim et al. | |
| 2015/0060790 A1* | 3/2015 | Kim | H01L 51/5246 257/40 |
| 2015/0243711 A1* | 8/2015 | Hong | H01L 27/323 257/40 |

FOREIGN PATENT DOCUMENTS

| | | |
|---|---|---|
| KR | 10-2011-0053803 | 5/2011 |
| KR | 10-2011-0101419 | 9/2011 |
| KR | 10-2012-0139075 | 12/2012 |
| KR | 10-2015-0114328 | 10/2015 |

\* cited by examiner

DISPLAY APPARATUS

CROSS-REFERENCE TO RELATED APPLICATION

This application claims priority under 35 U.S.C. § 119 from, and the benefit of, Korean Patent Application No. 10-2018-0087274, filed on Jul. 26, 2018 in the Korean Intellectual Property Office, the contents of which are herein incorporated by reference in their entirety.

BACKGROUND

1. Technical Field

One or more embodiments are directed to a display apparatus.

2. Discussion of the Related Art

Various flat panel display apparatuses that have excellent characteristics, such as a small thickness, light weight, and low power consumption, etc., have been rapidly developed as display devices for visually expressing information. An organic light-emitting display apparatus is a self-emissive display apparatus that does not need an additional light source, and thus, can be operated with a low voltage and has a light weight and small thickness. In addition, the organic light-emitting display apparatus is being promoted as a next generation display apparatus due to characteristics such as wide viewing angles, high contrast, fast response speeds, etc. However, since an organic light-emitting device deteriorates due to external moisture or oxygen, external moisture or oxygen should be prevented from infiltrating into the organic light-emitting device.

For example, an organic light-emitting display apparatus can be sealed by applying a sealing material between a pair of substrates and curing the sealing material by irradiating a laser beam to the applied sealing material. However, since a profile of the irradiated laser beam generally has a Gaussian distribution, a center portion and an outer portion of the sealing material are unevenly heated and the bonding force may vary according to a location of the sealing material. In addition, to reduce dead areas in the light-emitting display apparatus, wires of the display apparatus are placed below the sealing material, and the wires located under the sealing material can be partially melted and reflow may occur. Accordingly, height differences can occur in the cured sealing material, and thus, cracks can occur in the sealing material.

SUMMARY

One or more embodiments include a display apparatus in which sealing material defects can be prevented, and dead areas can be reduced.

According to one or more embodiments, a display apparatus includes: a substrate that includes a display area and a peripheral area around the display area; an encapsulation substrate on the substrate; a sealing portion disposed in the peripheral area between the substrate and the encapsulation substrate, wherein the sealing portion surrounds the display area; and a pattern portion on the encapsulation substrate that overlaps the sealing portion while extending parallel to the sealing portion. The pattern portion includes a plurality of block patterns that are spaced apart from one another and a plurality of opening regions that alternate with the plurality of block patterns, and a first block pattern of the plurality of block patterns that has a largest width is located at a center of the pattern portion.

The plurality of block patterns and the plurality of opening regions may have widths that sequentially decrease from the center of the pattern portion towards an outer portion of the pattern portion.

The plurality of block patterns and the plurality of opening regions may configure a linear zone plate pattern.

An external side surface of the substrate, an external side surface of the encapsulation substrate, and an external surface of the sealing portion may be flush with each other.

Block patterns of the plurality of block patterns other than the first block pattern may include a plurality of gaps that divide the block patterns into a plurality of pieces in a lengthwise direction of the block patterns.

The display apparatus may further include a power supply line between the substrate and the sealing portion, wherein the sealing portion covers an external side of the power supply line.

Pixels may be disposed in the display area of the substrate, an emission driving circuit that transmits an emission control signal to each pixel is disposed in the peripheral area, and the emission driving circuit may be located under the power supply line.

The pattern portion may be disposed on at least one of an upper surface and a lower surface of the encapsulation substrate.

According to one or more embodiments, a display apparatus includes: a substrate that includes a display area and a peripheral area around the display area; an encapsulation substrate on the substrate; a sealing portion disposed on the peripheral area between the substrate and the encapsulation substrate, wherein the sealing portion surrounds the display area; and a pattern portion on the encapsulation substrate that overlaps the sealing portion while extending parallel to the sealing portion. The pattern portion includes a plurality of block patterns that are spaced apart from one another and a plurality of opening regions that alternate with the plurality of block patterns, and a center of the pattern portion is located outward from a center of the sealing portion.

The display apparatus may further include a power supply line between the substrate and the sealing portion, wherein the sealing portion directly contacts the power supply line while partially overlapping the power supply line.

Pixels may be disposed in the display area of the substrate, an emission driving circuit that transmits an emission control signal to each pixel is disposed in the peripheral area, and the emission driving circuit may be located under the power supply line and a width of the power supply line entirely covers the emission driving circuit.

Each pixel may include a pixel circuit that includes a driving thin film transistor, a switching thin film transistor, and a storage capacitor, and an organic light-emitting diode connected to the pixel circuit.

A first block pattern of the plurality of block patterns that has a largest width may be located at the center of the pattern portion.

The plurality of block patterns and the plurality of opening regions may configure a linear zone plate pattern.

Block patterns of the plurality of block patterns other than the first block pattern may include a plurality of gaps that divide the block patterns into a plurality of pieces in a lengthwise direction of the block patterns.

The plurality of block patterns and the plurality of opening regions may have widths that sequentially decrease from the center of the pattern portion towards an outer portion of the pattern portion.

An external side surface of the substrate, an external side surface of the encapsulation substrate, and an external surface of the sealing portion may be flush with each other.

The pattern portion may be disposed on at least one of an upper surface and a lower surface of the encapsulation substrate.

According to one or more embodiments, a display apparatus includes: a substrate that includes a display area and a peripheral area around the display area; an encapsulation substrate on the substrate; a sealing portion disposed in the peripheral area between the substrate and the encapsulation substrate, wherein the sealing portion surrounds the display area; and a pattern portion on the encapsulation substrate that overlaps the sealing portion while extending parallel to the sealing portion. The pattern portion includes a plurality of block patterns that are spaced apart from one another and a plurality of opening regions that alternate with the plurality of block patterns, and widths of the plurality of block patterns and widths of the plurality of opening regions sequentially decrease from the center of the pattern portion towards an outer portion of the pattern portion.

Block patterns of the plurality of block patterns other than a centermost block pattern may include a plurality of gaps that divide the block patterns into a plurality of pieces in a lengthwise direction of the block patterns.

DETAILED DESCRIPTION

Figure 1:
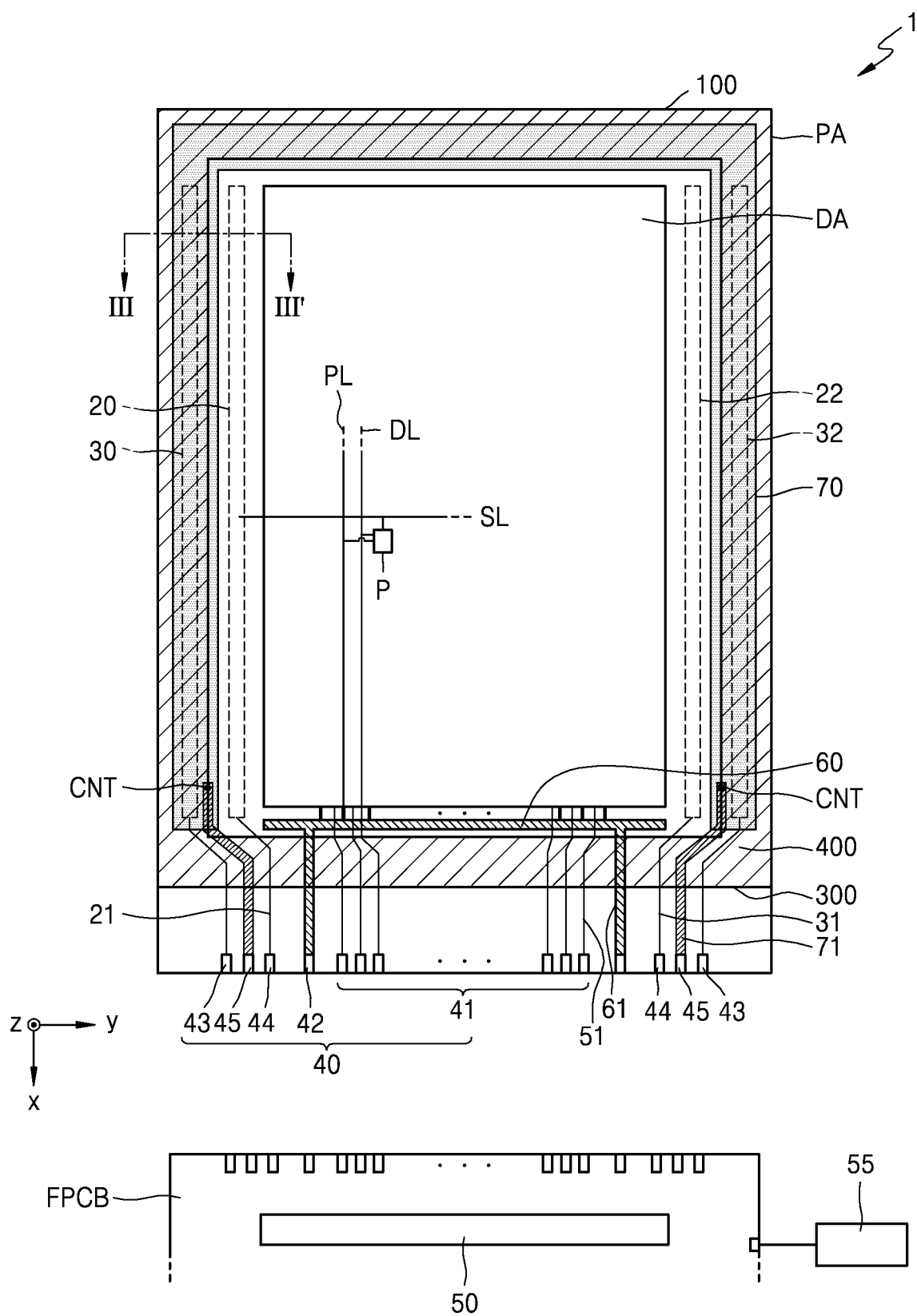
FIG. 1 is a plan view of a display apparatus according to an embodiment.

Reference will now be made in detail to exemplary embodiments, examples of which are illustrated in the accompanying drawings, wherein like reference numerals may refer to like elements throughout. In this regard, the present embodiments may have different forms and should not be construed as being limited to the descriptions set forth herein.

It will be understood that when a layer, region, or component is referred to as being "formed on" another layer, region, or component, it can be directly or indirectly formed on the other layer, region, or component.

Sizes of components in the drawings may be exaggerated for convenience of explanation.

Exemplary embodiments will be described below in more detail with reference to the accompanying drawings. Those components that are the same or are in correspondence may have the same reference numeral regardless of the figure number.

Figure 2:
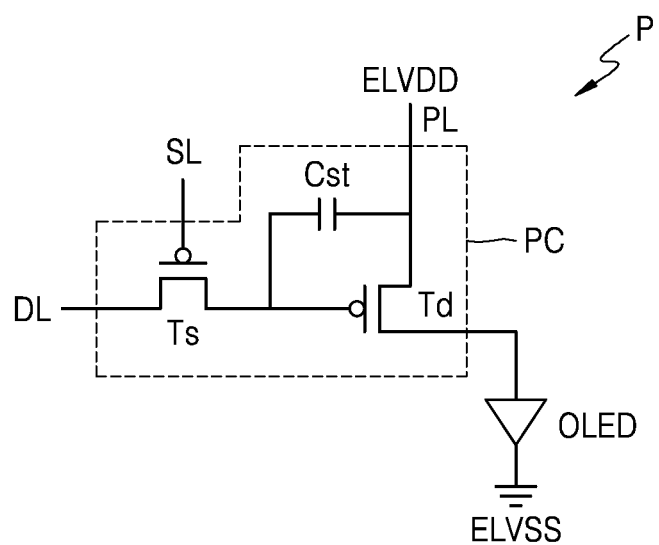
FIG. 2 is an equivalent circuit diagram of one pixel in a display apparatus according to an embodiment.

FIG. 1 is a plan view of a display apparatus 1 according to an embodiment, and FIG. 2 is an equivalent circuit diagram of one pixel in the display apparatus 1 according to an embodiment.

Referring to FIG. 1, according to an embodiment, the display apparatus 1 includes a display area DA in which images are displayed and a peripheral area PA around the display area DA. In the display area DA, pixels P are located that are connected to scan lines SL that extend in a y direction and data lines DL that extend in an x direction that crosses the y direction. Each of the pixels P may emit, for example, red light, green light, blue light, or white light. Each pixel P includes a display device. For example, the display device may be an organic light-emitting diode.

Referring to FIG. 2, according to an embodiment, the pixel P include a pixel circuit PC connected to the scan line SL and the data line DL, and an organic light-emitting diode OLED connected to the pixel circuit PC. The pixel circuit PC includes a driving thin film transistor Td, a switching thin film transistor Ts, and a storage capacitor Cst. The switching thin film transistor Ts is connected to the scan line SL and the data line DL and transmits a data signal received through the data line DL to the driving thin film transistor Td according to a scan signal received through the scan line SL.

According to an embodiment, the storage capacitor Cst is connected to the switching thin film transistor Ts and a driving voltage line PL and stores a voltage that corresponds to a difference between a voltage received from the switching thin film transistor Ts and a driving voltage ELVDD received from the driving voltage line PL.

According to an embodiment, the driving thin film transistor Td is connected to the driving voltage line PL and the storage capacitor Cst and controls a driving current flowing from the driving voltage line PL to the organic light-emitting diode OLED in response to the voltage value stored in the storage capacitor Cst. The organic light-emitting diode OLED emits light having a predetermined luminance according to the driving current. The organic light-emitting diode OLED emits, for example, red light, green light, blue light, or white light.

FIG. 2 shows an example in which the pixel P includes two thin film transistors and one storage thin film transistor, but embodiments are not limited thereto. For example, the pixel P may include three or more thin film transistors or two or more storage thin film transistors.

Referring back to FIG. 1, according to an embodiment, the peripheral area PA is located on an outer portion of the display area DA. For example, the peripheral area PA surrounds the display area DA. No pixels are disposed in the peripheral area PA, and thus, the peripheral area PA is a non-display area that does not display images.

In the peripheral area PA, according to an embodiment, a drive circuit, such as first drivers, second drivers, a terminal unit 40, a driving power supply line 60, and a common power supply line 70, are disposed. The first drivers include first and second emission driving circuits 30 and 32 and the second drivers include first and second scan driving circuits 20 and 22.

According to an embodiment, the first and second scan driving circuits 20 and 22 are disposed on the peripheral area PA of substrate 100 and generate a scan signal and transmit the scan signal to each pixel P via the scan lines SL. For example, the first scan driving circuit 20 is disposed at a left side of the display area DA and the second scan driving circuit 22 is disposed at a right side of the display area DA, but embodiments are not limited thereto. For example, only one scan driving circuit may be provided.

According to an embodiment, the terminal unit 40 is disposed at an end portion of the substrate 100 and includes a plurality of terminals 41, 42, 43, 44, and 45. The terminal unit 40 is not covered by an insulating layer but is exposed, and is electrically connected to a flexible printed circuit board FPCB. The terminal unit 40 is disposed at a side of the substrate 100, where the first and second scan driving circuits 20 and 22 are not located.

According to an embodiment, the flexible printed circuit board FPCB electrically connects a controller 55 to the terminal unit 40, and signals or power transmitted from the controller 55 are transmitted via connection wirings 21, 31, 51, 61, and 71 connected to the terminal unit 40.

According to an embodiment, the controller 55 generates a control signal that controls driving of the first and second scan driving circuits 20 and 22 by receiving a vertical synchronization signal, a horizontal synchronization signal, and a clock signal. The generated control signal is transmitted to each of the first and second scan driving circuits 20 and 22 via the terminal 44 connected to the flexible printed circuit board FPCB and the connection wirings 21 and 31, and scan signals of the first and second scan driving circuits 20 and 22 are transmitted to each pixel P via the scan lines SL. In addition, the controller 55 transmits a driving power ELVDD and a common power ELVSS respectively to the driving power supply line 60 and the common power supply line 70 via the terminals 42 and 45 and the connection wirings 61 and 71 connected to the flexible printed circuit board FPCB. The driving power ELVDD is transmitted to each pixel P via the driving voltage lines PL, and the common power ELVSS is transmitted to a common electrode of each pixel P.

According to an embodiment, a data driving circuit 50 is disposed on the flexible printed circuit board FPCB. The data driving circuit 50 transmits a data signal to each pixel P. The data signal of the data driving circuit 50 is transmitted to each pixel P via the connection wiring 51 connected to the terminal 41 and the data lines DL connected to the connection wiring 51. FIG. 1 shows that the data driving circuit 50 is disposed on the flexible printed circuit board FPCB, but embodiments are not limited thereto. In another embodiment, the data driving circuit 50 is disposed on the peripheral area PA of the substrate 100.

According to an embodiment, the driving power supply line 60 is disposed on the peripheral area PA. For example, the driving power supply line 60 is disposed between a side of the display area DA that is adjacent to the terminal unit 40, and the terminal unit 40. The driving power ELVDD transmitted through the connection wiring 61 connected to the terminal 41 is transmitted to each of the pixels P via the driving voltage lines PL.

According to an embodiment, the common power supply line 70 is disposed on the peripheral area PA and partially surrounds the display area DA. For example, the common power supply line 70 has a loop shape with an opening adjacent to the terminal unit 40 and extends along edges of the substrate 100 except for the edge of the terminal unit 40.

According to an embodiment, the common power supply line 70 is electrically connected to the connection wiring 71 that is connected to the terminal 45 and transmits the common power ELVSS to the common electrode, such as a cathode, of the organic light-emitting diode OLED in the pixel P. FIG. 1 shows that the connection wiring 71 contacts a first end portion and a second end portion of the common power supply line 70 via contact holes CNT. In another embodiment, the connection wiring 71 is a loop that has an opening and partially surrounds the display area DA. In this case, the connection wiring 71 overlaps the common power supply line 70 and extends towards the edge of the substrate 100, i.e., the terminal unit 40, farther than the common power supply line 70.

According to an embodiment, the first and second emission driving circuits 30 and 32 are disposed on the peripheral area PA of the substrate 100 and generate and transmit an emission control signal to each pixel P via a light-emitting control line. For example, the first emission driving circuit 30 is disposed at a left side of the display area DA and the second emission driving circuit 32 is disposed at a right side of the display area DA, but embodiments are not limited thereto. For example, only one emission driving circuit may be provided.

Referring to FIG. 1, according to an embodiment, the first and second scan driving circuits 20 and 22 are disposed adjacent to the display area DA, and the first and second emission driving circuits 30 and 32 are disposed closer to the edges of the substrate 100 than the first and second scan driving circuits 20 and 22. Here, the first and second emission driving circuits 30 and 32 overlap the common power supply line 70 and are disposed under the common power supply line 70.

According to an embodiment, on the substrate 100 that includes the above-described elements, an encapsulation substrate 300 is disposed that faces the substrate 100, and a sealing portion 400 is provided between the substrate 100 and the encapsulation substrate 300. The sealing portion 400 surrounds the display area DA in a plan view as shown in FIG. 1. A space between the substrate 100, the encapsulation substrate 300, and the sealing portion 400 is spatially isolated from the outside to prevent external moisture or impurities from infiltrating therein. The sealing portion 400 includes, for example, an inorganic material such as a frit, but embodiments are not limited thereto. For example, the sealing portion 400 includes epoxy, etc.

According to an embodiment, the sealing portion 400 is disposed to at least partially overlap the common power supply line 70. Here, the first and second emission driving circuits 30 and 32 are located under the common power supply line 70 and overlap the common power supply line 70 and also overlap the sealing portion 400. Therefore, a dead area in the display apparatus 1 can be reduced.

Figure 3:
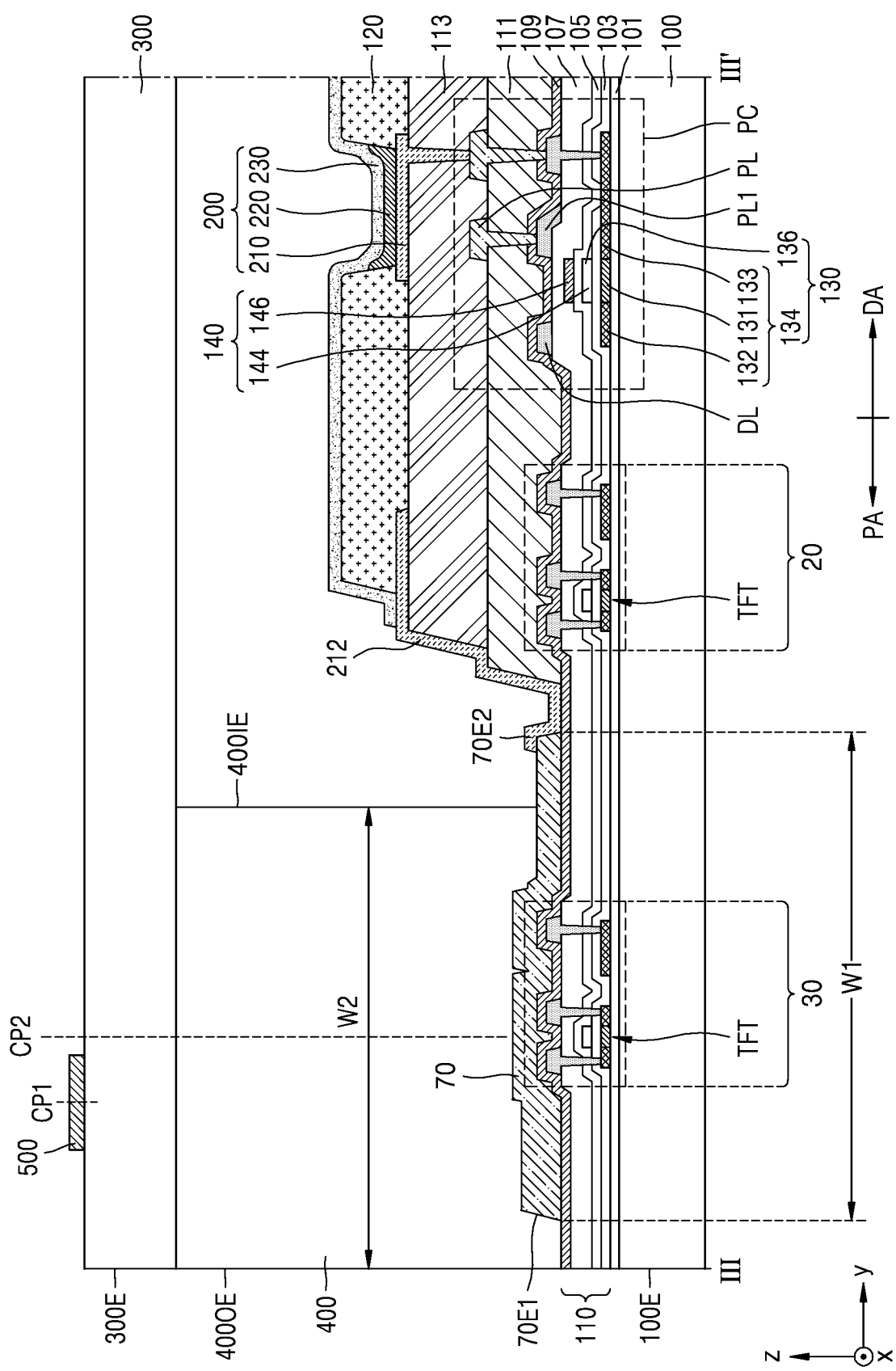
FIG. 3 is a cross-sectional view of a display apparatus taken along a line III-III' of FIG. 1.

FIG. 3 is a cross-sectional view of the display apparatus 1 taken along a line III-III' of FIG. 1.

Referring to FIG. 3, according to an embodiment, the display apparatus 1 includes the display area DA and the peripheral area PA. The substrate 100 also includes the above display area DA and the peripheral area PA.

According to an embodiment, the substrate 100 includes various materials, such as a glass, a metal, a plastic such as polyethylene terephthalate (PET), polyethylene naphthalate (PEN), polyimide, etc. The encapsulation substrate 300 includes a transparent material. For example, the encapsulation substrate 300 includes various materials, such as a glass, a plastic such as PET, PEN, polyimide, etc. The substrate 100 and the encapsulation substrate 300 may include the same material, or materials that differ from each other.

According to an embodiment, a buffer layer 101 is disposed on the substrate 100. The buffer layer 101 can block impurities or moisture that infiltrates through the substrate 100. For example, the buffer layer 101 includes an inorganic material, such as silicon oxide ($SiO_x$), silicon nitride ($SiN_x$), or silicon oxynitride (SiON), and may have a single-layered or multi-layered structure. The buffer layer 101 is positioned to correspond to the display area DA and the peripheral area PA.

According to an embodiment, on the display area DA of the substrate 100, a thin film transistor 130, a storage capacitor 140, and a display device 200 are disposed, where the display device 200 is electrically connected to the thin film transistor 130 and the storage capacitor 140, that is, the organic light-emitting diode OLED. The thin film transistor 130 of FIG. 3 corresponds to the driving thin film transistor Td of FIG. 2 included in the pixel circuit PC, and the storage capacitor 140 corresponds to the storage capacitor Cst of FIG. 2.

According to an embodiment, the thin film transistor 130 includes a semiconductor layer 134 and a gate electrode 136. The semiconductor layer 134 includes, for example, polysilicon. The semiconductor layer 134 includes a channel region 131 that overlaps the gate electrode 136, and a source region 132 and a drain region 133 at opposite sides of the channel region 131 and doped with impurities at a higher concentration than that of the channel region 131. Here, the impurities may include N-type impurities or P-type impurities. The source region 132 and the drain region 133 function as a source electrode and a drain electrode of the thin film transistor 130. In another embodiment, the semiconductor layer 134 includes amorphous silicon, or an organic semiconductor material. In another embodiment, the semiconductor layer 134 includes an oxide semiconductor.

In addition, according to an embodiment, the pixel circuit PC further includes the switching thin film transistor Ts of FIG. 2 described above. In addition, the semiconductor layer 134 of the thin film transistor 130 and a semiconductor layer of the switching thin film transistor Ts include materials that differ from each other. For example, one of the semiconductor layer 134 of the thin film transistor 130 or the semiconductor layer of the switching thin film transistor Ts includes an oxide semiconductor, and the other includes polysilicon.

According to an embodiment, a gate insulating layer 103 is disposed between the semiconductor layer 134 and the gate electrode 136. The gate insulating layer 103 includes an inorganic insulating layer that includes SiON, SiOx, or SiNx, and the inorganic insulating layer may have a single-layered or multi-layered structure.

According to an embodiment, the storage capacitor 140 includes a lower electrode 144 and an upper electrode 146 that overlap each other. A first interlayer insulating layer 105 is disposed between the lower electrode 144 and the upper electrode 146 of the storage capacitor 140.

According to an embodiment, the first interlayer insulating layer 105 has a predetermined susceptibility and includes an inorganic insulating layer such as SiON, SiOx, or SiNx in a single-layered or multi-layered structure. FIG. 3 shows an example in which the storage capacitor 140 overlaps the thin film transistor 130 and the lower electrode 144 is the gate electrode 136 of the thin film transistor 130, but embodiments are not limited thereto. In another embodiment, the storage capacitor 140 does not overlap the thin film transistor 130, and the lower electrode 144 is a separate element from the gate electrode 136 of the thin film transistor 130.

According to an embodiment, the storage capacitor 140 is covered by a second interlayer insulating layer 107. The second interlayer insulating layer 107 includes an inorganic insulating layer that includes SiON, SiOx, or SiNx and may have a single-layered or multi-layered structure.

According to an embodiment, the driving voltage line PL is disposed on a first organic insulating layer 111. The driving voltage line PL includes one or more of aluminum (Al), copper (Cu), titanium (Ti), etc., and may have a single-layered or multi-layered structure. In an embodiment, the driving voltage line PL has a multi-layered structure that includes Ti/Al/Ti.

According to an embodiment, FIG. 3 shows that a lower driving voltage line PL1 is further provided under the first organic insulating layer 111. The lower driving voltage line PL1 is electrically connected to the driving voltage line PL via a contact hole that penetrates through the first organic insulating layer 111, and prevents a voltage drop of the driving voltage ELVDD transmitted through the driving voltage line PL. The lower driving voltage line PL1 includes a material that is the same as that included in the data line DL. For example, the lower driving voltage line PL1 and the data line DL include one of Al, Cu, Ti, etc., and may have a single-layered or multi-layered structure. In an embodiment, the lower driving voltage line PL1 and the data line DL have a multi-layered structure that includes Ti/Al/Ti or TiN/Al/Ti.

According to an embodiment, the first organic insulating layer 111 includes an organic insulating material. The organic insulating material may include a general universal polymer such as polymethylmethacrylate (PMMA) or polystyrene (PS), polymer derivatives that have phenol groups, an acryl-based polymer, an imide-based polymer, an aryl ether-based polymer, an amide-based polymer, a fluoride-based polymer, a p-xylene-based polymer, a vinyl alcohol-based polymer, or blends thereof. In an embodiment, the first organic insulating layer 111 includes polyimide.

According to an embodiment, the driving voltage line PL is covered by a second organic insulating layer 113, and the second organic insulating layer 113 may include a general universal polymer, such as PMMA or PS, polymer derivatives that have phenol groups, an acryl-based polymer, an imide-based polymer, an aryl ether-based polymer, an amide-based polymer, a fluoride-based polymer, a p-xylene-based polymer, a vinyl alcohol-based polymer, or blends thereof. In an embodiment, the second organic insulating layer 113 includes polyimide.

According to an embodiment, a pixel electrode 210 is disposed on the second organic insulating layer 113. A pixel defining layer 120 is disposed on the pixel electrode 210, and the pixel defining layer 120 has an opening that corresponds to a pixel, that is, an opening that exposes at least a center portion of the pixel electrode 210 that is a light-emission region. In addition, the pixel defining layer 120 increases a distance between an edge of the pixel electrode 210 and a common electrode 230, to prevent the generation of an arc between the pixel electrode 210 and the common electrode 230. The pixel defining layer 120 includes an organic material, such as polyimide, hexamethyl disiloxane (HMDSO), etc.

According to an embodiment, an intermediate layer 220 includes a low-molecular weight organic material or a polymer. When the intermediate layer 220 includes a low-molecular weight material, the intermediate layer 220 includes a hole injection layer (HIL), a hole transport layer (HTL), an emission layer (EML), an electron transport layer (ETL), and an electron injection layer (EIL) in a single or multiple-layered structure. Examples of a low-molecular weight material include copper phthalocyanine (CuPc), N,N'-Di(naphthalene-1-yl)-N,N'-diphenyl-benzidine (NPB), or tris-8-hydroxyquinoline aluminum ($Alq_3$). The above layers can be manufactured by a vacuum deposition method.

According to an embodiment, when the intermediate layer 220 includes a polymer, the intermediate layer 220 includes an HTL and an EML. Here, the HTL includes PEDOT, and the EML includes a poly-phenylenevinylene (PPV)-based or polyfluorene-based polymer material. The intermediate layer 220 is not limited to the above examples and can have various other structures. For example, the intermediate layer 220 can include at least one layer that is integrally formed throughout a plurality of pixel electrodes 210. Alternatively, the intermediate layer 220 can include a layer that is patterned to correspond to each of the plurality of pixel electrodes 210.

According to an embodiment, the common electrode 230 is disposed above the display area DA and covers the display area DA. That is, the common electrode 230 is integrally formed and covers a plurality of pixels.

According to an embodiment, a filling material is disposed between the common electrode 230 and the encapsulation substrate 300. The filling material includes, for example, one or more of a photo-curable epoxy-based material or an acrylate-based material, but embodiments are not limited thereto.

In addition, according to an embodiment, the first driver 30, the second driver 20, and the common power supply line 70 are disposed on the peripheral area PA of the substrate 100. For example, the first driver 30 is the first emission driving circuit 30, and the second driver 20 is the first scan driving circuit 20.

According to an embodiment, the first scan driving circuit 20 and the first emission driving circuit 30 respectively include thin film transistors TFT, and wirings connected to the thin film transistors TFT. The thin film transistor TFT can be manufactured through the same manufacturing process as the thin film transistor 130 of the pixel circuit PC.

According to an embodiment, the first scan driving circuit 20 and the first emission driving circuit 30 include insulating layers 110 between the elements of the thin film transistor TFT, such as a semiconductor layer, a gate electrode, etc. For example, the gate insulating layer 103, the first interlayer insulating layer 105, and the second interlayer insulating layer 107 extend in to the peripheral area PA to comprise the insulating layers 110.

According to an embodiment, the first scan driving circuit 20 and the first emission driving circuit 30 are covered by an inorganic insulating layer 109. The inorganic insulating layer 109 prevent wirings that include metals such as aluminum, which can be damaged by an etchant, from being exposed to an etching environment during a process of manufacturing the display apparatus 1. The inorganic insulating layer 109 is disposed on the display area DA as well as the peripheral area PA.

According to an embodiment, the inorganic insulating layer 109 includes an inorganic material, such as SiOx, SiNx, or SiON, and may have a single-layered or multi-layered structure. In an embodiment, the inorganic insulating layer 109 includes SiNx. The inorganic insulating layer 109 has a thickness of about 500 Å or greater. In another embodiment, the inorganic insulating layer 109 has a thickness of 1000 Å or greater, 1500 Å or greater, 2000 Å or greater, 2500 Å or greater, 3000 Å or greater, 3500 Å or greater, 4000 Å or greater, 4500 Å or greater, 5000 Å or greater, 5500 Å or greater, 6000 Å or greater, or 6500 Å or greater. Alternatively, the inorganic insulating layer 109 may have a thickness of 7000 Å to 10000 Å.

In addition, according to an embodiment, the first scan driving circuit 20 is closer to the display area DA than the first emission driving circuit 30, and the first scan driving circuit 20 is covered by the first and second organic insulating layers 111 and 113. Therefore, the peripheral area PA can be reduced in size. In another embodiment, the first and second organic insulating layers 111 and 113 do not cover the first scan driving circuit 20, and only the inorganic insulating layer 109 is disposed on the first scan driving circuit 20.

According to an embodiment, the common power supply line 70 is disposed to overlap the first emission driving circuit 30 with the inorganic insulating layer 109 therebetween. The common power supply line 70 includes a material that is the same as that included in the driving voltage line PL. For example, the common power supply line 70 has a multi-layered structure that includes Ti/Al/Ti.

According to an embodiment, an external side 70E1 of the common power supply line 70 is covered by a sealing portion 400, and an internal side 70E2 opposite to the external side 70E1 is covered by a conductive layer 212. The conductive layer 212 includes a material that is the same as that included in the pixel electrode 210. The conductive layer 212 is connected to the common electrode 230. In another embodiment, the internal side 70E2 of the common power supply line 70 extends towards the display area DA to directly contact the common electrode 230.

In addition, according to an embodiment, the common power supply line 70 has a width W1 that is sufficient to completely cover the first emission driving circuit 30. Here, the width W1 of the common power supply line 70 denotes a shortest distance between the external side 70E1 and the opposite internal side 70E2 of the common power supply line 70. Therefore, damage to the first emission driving circuit 30 due to external static electricity can be prevented, and a resistance of the common power supply line 70 itself is reduced to prevent a voltage drop of the common power voltage ELVSS transmitted to the common electrode 230.

According to an embodiment, the sealing portion 400 bonds the substrate 100 to the encapsulation substrate 300. The sealing portion 400 may include a frit or an epoxy. The frit is a paste that includes a main ingredient such as $SiO_2$, a laser or infrared (IR) absorbent, an organic binder, a filler that reduces a thermal expansion coefficient, etc. The frit in the paste phase undergoes a drying and baking process to remove the organic binder and moisture, and is then cured. The laser or IR absorbent includes a transition metal compound. The frit is cured by a laser, etc., to form the sealing portion 400.

According to an embodiment, the sealing portion 400 covers the external side 70E1 of the common power supply line 70 and directly contacts the common power supply line 70 while overlapping the common power supply line 70. In addition, the first emission driving circuit 30 is disposed under the sealing portion 400. Therefore, a dead area of the display apparatus 1 can be reduced as compared with the related art, in which the sealing portion 400 is located on an outer portion of the first emission driving circuit 30 or the common power supply line 70.

According to an embodiment, a pattern portion 500 is disposed on the encapsulation substrate 300. The pattern portion 500 overlaps the sealing portion 400 and extends substantially parallel to the sealing portion 400. Although FIG. 3 shows the pattern portion 500 positioned on an upper surface of the encapsulation substrate 300, embodiments are not limited thereto. That is, the pattern portion 500 may be located on a lower surface of the encapsulation substrate 300, wherein the lower surface faces the substrate 100. Alternatively, the pattern portion 500 may be disposed on upper and lower surfaces of the encapsulation substrate 300.

That is, the pattern portion 500 may be disposed on at least one of the upper and lower surfaces of the encapsulation substrate 300.

According to an embodiment, when a laser beam is irradiated onto the sealing portion 400, the pattern portion 500 causes the temperature of the sealing portion 400 that is melted by the laser beam to be evenly distributed throughout an entire width W2 of the sealing portion 400. Here, the width W2 of the sealing portion 400 is measured in a direction perpendicular to a lengthwise direction of the sealing portion 400 and denotes a distance between an external surface 400OE and an internal surface 400IE of the sealing portion 400. That is, when an intensity profile of the irradiated laser beam has a Gaussian distribution, the laser beam propagating through the pattern portion 500 changes to have reduced energy at a center region of the Gaussian distribution. Therefore, the entire sealing portion 400 can be evenly cured.

In addition, according to an embodiment, since the energy of the irradiated laser beam at the center region thereof is reduced by propagating through the pattern portion 500, heat transferred to the common power supply line 70 while irradiating the laser beam can be reduced. Therefore, when the laser beam is irradiated, the occurrence of reflow due to the common power supply line 70 being partially melted can be prevented, and accordingly, generation of height differences on the sealing portion 400 can be prevented. Thus, generation of defects such as cracks in the sealing portion 400 can be prevented.

According to an embodiment, a center CP1 of the width of the pattern portion 500 is located outward from a center CP2 of the width W2 of the sealing portion 400. Here, the width of the pattern portion 500 is measured in the same direction as the width W2 of the sealing portion 400.

In addition, the display apparatus 1 according to an embodiment can be manufactured by cutting the substrate 100, the sealing portion 400, and the encapsulation substrate 300 together, and accordingly, an external side surface 100E of the substrate 100, an external side surface 300E of the encapsulation substrate 300, and the external surface 400OE of the sealing portion 400 are flush with each other. Here, the pattern portion 500 is positioned to correspond to a center region of the laser beam that is irradiated to cure the sealing portion 400 before cutting the substrate 100, the sealing portion 400, and the encapsulation substrate 300. After curing the sealing portion 400, the sealing portion 400 is cut together with the substrate 100 and the encapsulation substrate 300, and thus, the width W2 of the sealing portion 400 is reduced and the center CP2 of the sealing portion 400 is shifted towards the internal surface 400IE thereof. Therefore, the center CP1 of the width of the pattern portion 500 is located outward from the center CP2 of the width W2 of the sealing portion 400. For example, the pattern portion 500 does not entirely overlap the center CP2 of the width W2 of the sealing portion 400. In another example, although the center CP1 of the width of the pattern portion 500 is located outward from the center CP2 of the width W2 of the sealing portion 400, the pattern portion 500 may partially overlap the center CP2 of the width W2 of the sealing portion 400.

According to an embodiment, the pattern portion 500 may include various materials, such as a metal, an inorganic material, etc. For example, the pattern portion 500 is manufactured from wirings connected to a sensing pattern of a touch screen layer, when the touch screen layer is directly disposed on an upper surface of the encapsulation substrate 300.

Figure 4:
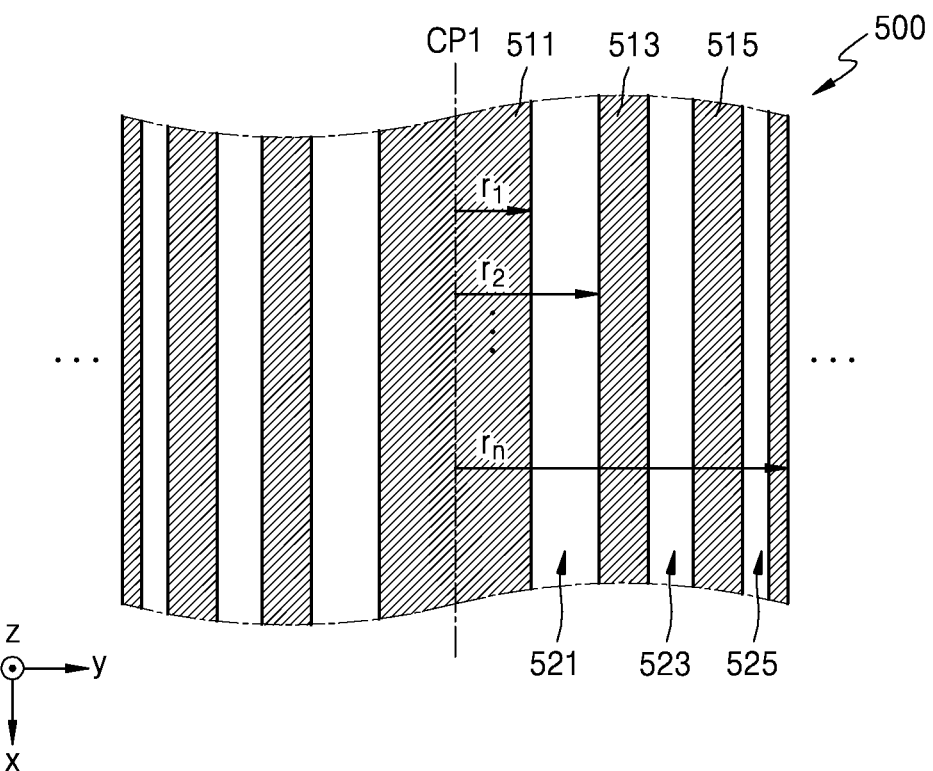
FIG. 4 is a plan view of an example of a pattern portion of FIG. 3.
Figure 5:
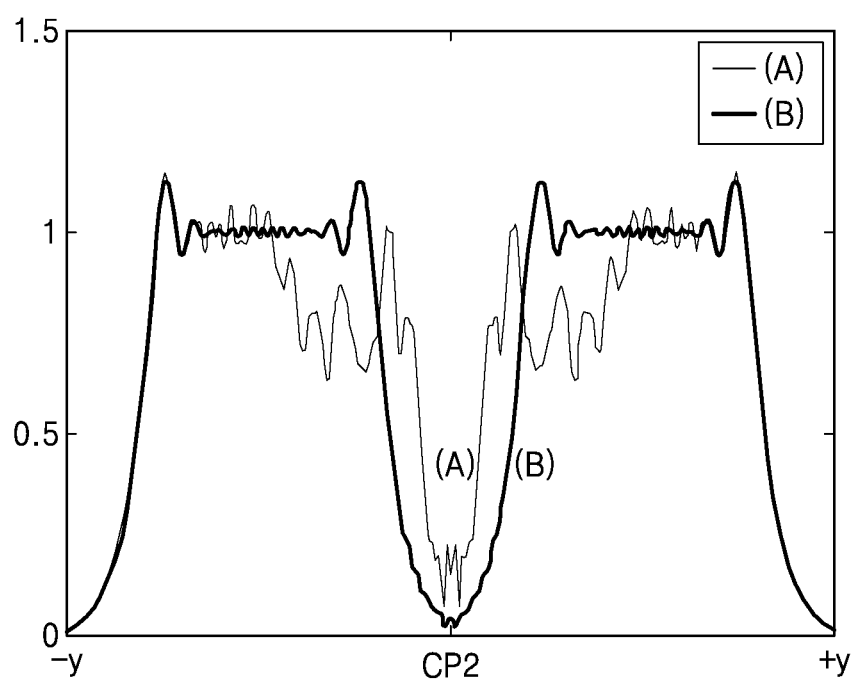
FIG. 5 illustrates a profile of a laser beam.
Figure 6:
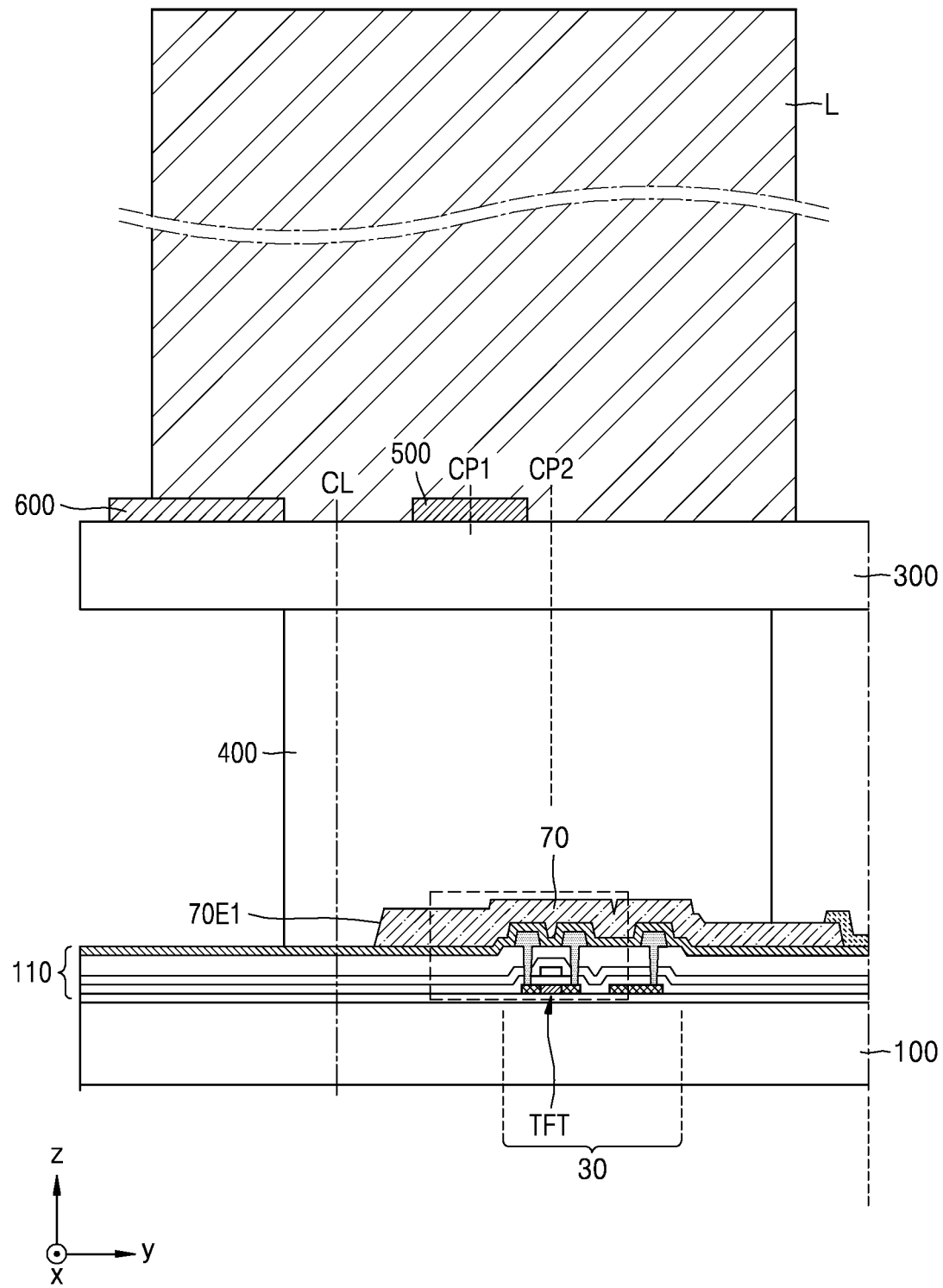
FIG. 6 is a cross-sectional view that illustrates some of processes of manufacturing the display apparatus of FIG. 1.

FIG. 4 is a plan view of an example of the pattern portion 500 of FIG. 3, FIG. 5 illustrates a profile of a laser beam propagating through the pattern portion 500, and FIG. 6 is a cross-sectional view that illustrates some of the processes of manufacturing the display apparatus 1 of FIG. 1.

Referring to FIG. 4, according to an embodiment, the pattern portion 500 includes a plurality of block patterns 511, 513, and 515 that are spaced apart from one another. In detail, the first block pattern 511 is located at the center CP1 of the pattern portion 500, a pair of second block patterns 513 are located at opposite sides of the first block pattern 511 and spaced apart from the first block pattern 511, and a pair of third block patterns 515 are located respectively on outer portions of the pair of second block patterns 513. Here, the first to third block patterns 511, 513, and 515 have widths that gradually decrease from the center CP1 of the pattern portion 500 to outer portions of the pattern portion 500.

In addition, according to an embodiment, first to third opening regions 521, 523, and 525 are located between the plurality of first to third block patterns 511, 513, and 515. In detail, first opening regions 521 are located respectively between the first and second block patterns 511 and 513, and second opening regions 523 are located respectively between the second and third block patterns 513 and 515. In addition, third opening regions 525 are located on outer portions of the third block patterns 515. Here, widths of the first to third opening regions 521, 523, and 525 gradually decrease from the center CP1 of the pattern portion 500 towards the outer portions of the pattern portion 500.

In addition, according to an embodiment, a width of the first block pattern 511 is greater than that of the first opening region 521, the width of the first opening region 521 may be greater than that of the second block pattern 513, and the width of the second block pattern 513 may be greater than that of the second opening region 523. That is, the widths of the plurality of block patterns 511, 513, and 515 and the widths of the plurality of opening regions 521, 523, and 525, wherein the block patterns 511, 513, and 515 and the opening regions 521, 523, and 525 are alternately arranged, gradually decrease from the center CP1 of the pattern portion 500 to the outer portions of the pattern portion 500.

According to an embodiment, the plurality of first, second, and third block patterns 511, 513, and 515 and the plurality of first, second, and third opening regions 521, 523, and 525 configure a linear zone plate pattern, but since the first block pattern 511 is located at the center CP1 of the pattern portion 500, the laser beam propagating through the pattern portion 500 is split and causes destructive interference around the center CP1 of the pattern portion 500. Therefore, a center portion of the laser beam propagating through the pattern portion 500 has reduced energy.

According to an embodiment, distances from the center CP1 of the pattern portion 500 to the plurality of first to third block patterns 511, 513, and 515 and the plurality of first to third opening regions 521, 523, and 525 can be calculated by Equation 1 below.

$$r_n = \sqrt{n\lambda f + \frac{n^2\lambda^2}{4}}$$

Here, λ denotes a wavelength of the irradiated laser beam and f denotes a value obtained by multiplying a thickness of the encapsulation substrate 300 by a refractive index. In addition, n denotes the ordinality of a block pattern or opening region in the sequence of block patterns and opening regions.

In addition, in Equation 1 above, since a value of $$\frac{n^2\lambda^2}{4}$$

is much less than $n\lambda f$, Equation 1 above can be approximated by Equation 2 below.

$$r_n \approx \sqrt{n\lambda f}$$

According to Equation 2 above, a width of the first block pattern 511 is r1×2 and a width of the first opening region 521 is r2−r1. In addition, a width of an n-th block pattern can be calculated by subtracting a distance rn from the center CP1 of the pattern portion 500 to the n-th block pattern from a distance rn+1 from the center CP1 of the pattern portion 500 to an n+1st opening region.

Table 1 below shows values of r1, r2, r3, and r4 when the wavelength (λ) of the laser beam is 808 nm and a thickness of the encapsulation substrate 300 that has a refractive index of 1.5 is 250 μm, and Table 2 below shows a result of calculating the widths of the first block pattern 511, the first opening region 521, the second block pattern 513, and the second opening region 523 from Table 1.

TABLE 1

| r1(μm) | r2(μm) | r3(μm) | r4(μm) |
|---|---|---|---|
| 17.4 | 24.6 | 30.1 | 34.8 |

TABLE 2

| | | |
|---|---|---|
| width of the first block pattern 511 | r1 × 2 | 348 μm |
| width of the first opening region 521 | r2 − r1 | 7.2 μm |
| width of the second block pattern 513 | r3 − r2 | 5.5 μm |
| width of the second opening region 523 | r4 − r3 | 4.7 μm |

That is, according to an embodiment, as shown in Table 2 above, the widths of the plurality of first to third block patterns 511, 513, and 515 and the widths of the plurality of first to third opening regions 521, 523, and 525, where the block patterns 511, 513, and 515 and the opening regions 521, 523, and 525 are alternately disposed, gradually decreases from the center CP1 of the pattern portion 500 towards the outer portions of the pattern portion 500. The above plurality of first to third block patterns 511, 513, and 515 and the plurality of first to third opening regions 521, 523, and 525 configure a pattern similar to a linear zone plate pattern, but a laser beam propagating through the pattern portion 500 is split and causes destructive interference around the center CP1 of the pattern portion 500.

According to an embodiment, FIG. 5 illustrates a profile of a laser beam passing through the pattern portion, where (A) denotes a case where the laser beam passes through the pattern portion 500 according to an embodiment of the present disclosure and (B) denotes a case where the laser beam passes through a pattern portion in which a simple shielding region is disposed at a center portion of the pattern portion. In detail, (A) of FIG. 5 denotes a case in which a laser beam propagates through a pattern portion in which n is 11, that is, first to sixth block patterns are arranged, and (B) denotes a case in which a laser beam passes through a pattern portion that has a blocking region that has an area that is equal to a sum of areas of the block patterns in the pattern portion of (A). That is, the areas of regions that block the laser beam are equal to each other in (A) and (B) of FIG. 5.

However, according to an embodiment, in case (B) of FIG. 5, energy of the center portion of the laser beam is excessively reduced by simply shielding the center portion of the laser beam, but in case (A) of FIG. 5, although the energy at the center portion of the laser beam is reduced, an energy amount sufficient to cure the sealing portion 400 is maintained. That is, the pattern portion 500 according to an embodiment of the present disclosure does not simply shield the laser beam, but causes destructive interference at the center portion of the laser beam through a diffraction effect. Thus, an laser beam profile appropriate for curing the sealing portion 400 can be obtained while reducing the energy at the center portion of the laser beam.

In addition, according to an embodiment, in the above-described pattern portion 500, the order n increases one by one, but embodiments of the present disclosure are not limited thereto, and the order n may increase by a constant number, such as 2 or greater, and accordingly, the profile of the laser beam propagating through the pattern portion 500 may be variously adjusted.

FIG. 6 is a cross-sectional view that illustrates some of the processes of manufacturing the display apparatus of FIG. 1, and illustrates a process of curing the sealing portion 400 to bond the substrate 100 to the encapsulation substrate 300. The sealing portion 400 is cured by irradiating a laser beam L towards the encapsulation substrate 300.

According to an embodiment, a block portion 600 and the pattern portion 500 are disposed on an upper surface of the encapsulation substrate 300. The block portion 600 and the pattern portion 500 include the same material as each other. The block portion 600 blocks the irradiated laser beam L to limit a curable portion of the sealing portion 400. The pattern portion 500 is disposed at a location that corresponds to a center portion of the irradiated laser beam L.

According to an embodiment, since the pattern portion 500 has an above-described structure, the energy at the center portion of the laser beam L propagating through the pattern portion 500 is reduced due to destructive interference, and thus, a temperature of the sealing portion 400 that is melted by the laser beam L is evenly distributed throughout the width of the sealing portion 400, and the sealing portion 400 can be evenly cured.

In addition, according to an embodiment, since the energy of the irradiated laser beam L at the center region is reduced by propagating through the pattern portion 500, less heat is transferred to the common power supply line 70 while irradiating the laser beam L. Therefore, when a laser beam is irradiated, the occurrence of reflow due to a partially melted common power supply line 70 can be prevented, and accordingly, generation of height differences on the sealing portion 400 can be prevented. Thus, generation of defects such as cracks in the sealing portion 400 can be prevented. In addition, damage to the thin film transistor TFT in the first driver 30 due to the heat of the irradiated laser beam L can be prevented.

In addition, according to an embodiment, after curing the sealing portion 400, the substrate 100, the sealing portion 400, and the encapsulation substrate 300 are cut together along a cutting line CL. Here, the insulating layers 110 on the substrate 100 are also cut. That is, the sealing portion 400, after being cured, is cut together with the substrate 100 and the encapsulation substrate 300, and thus, the width of the sealing portion 400 can be reduced, and the center CP2 of the sealing portion 400 is shifted inward. Therefore, the center CP1 of the width of the pattern portion 500 is located outward from the center CP2 of the width of the sealing portion 400. For example, the pattern portion 500 does not entirely overlap the center CP2 of the width of the sealing portion 400. For example, although the center CP1 of the width of the pattern portion 500 is located outward from the center CP2 of the width of the sealing portion 400, the pattern portion 500 partially overlaps the center CP2 of the width of the sealing portion 400.

Figure 7:
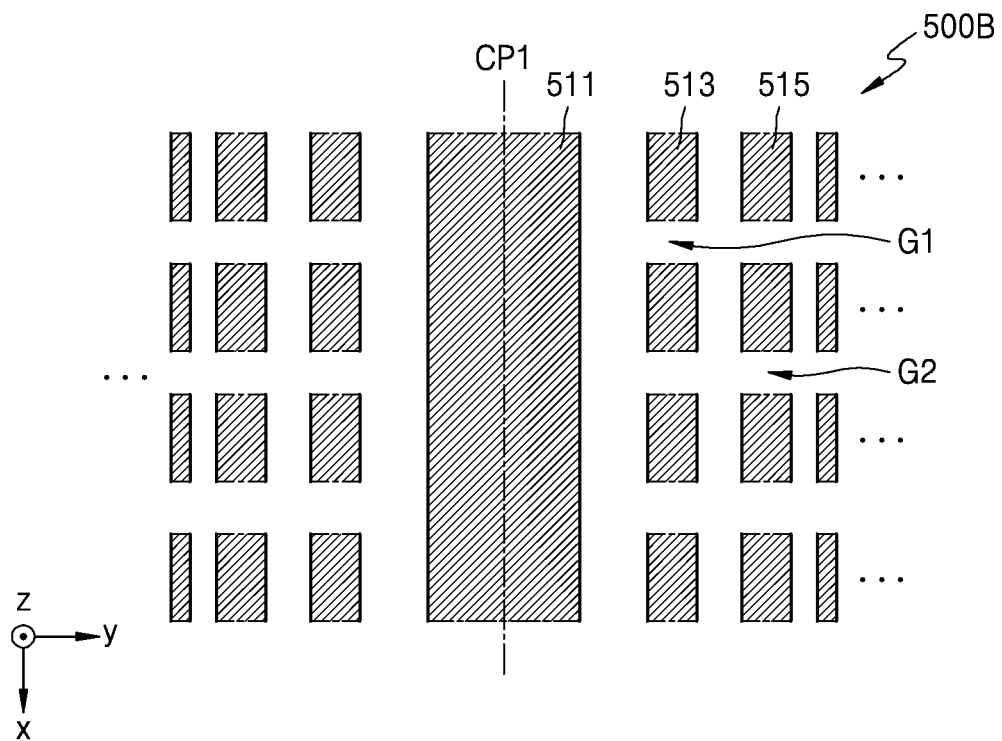
FIG. 7 is a plan view of another example of a pattern portion of FIG. 3.
Figure 8:
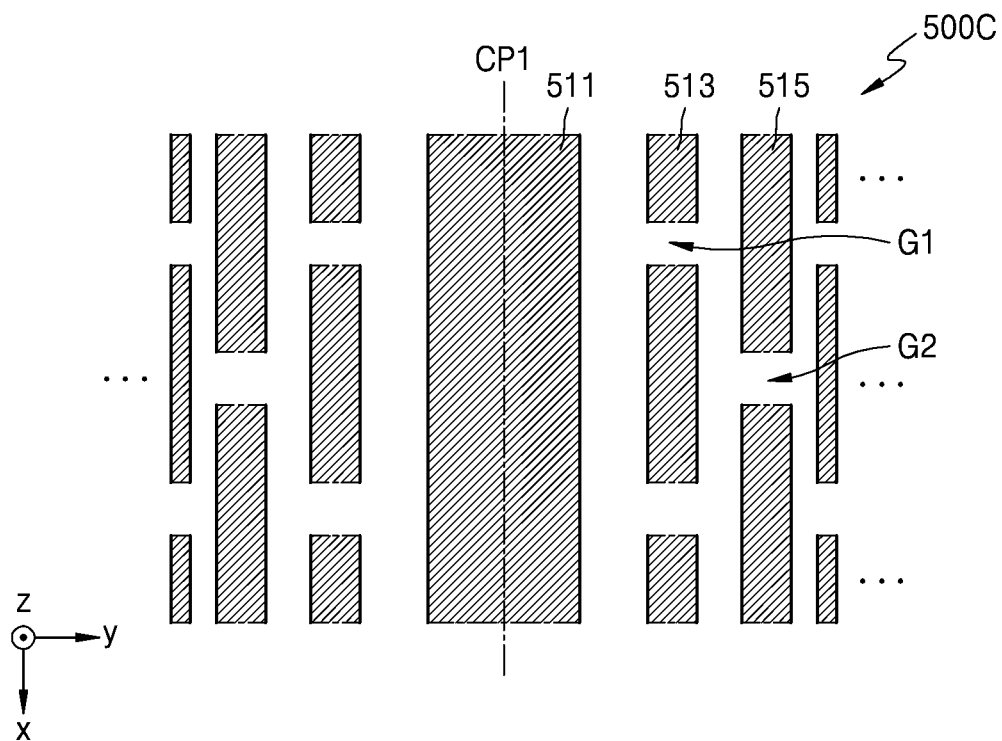
FIG. 8 is a plan view of another example of a pattern portion of FIG. 3.

FIG. 7 is a plan view of another example of the pattern portion 500 of FIG. 3, and FIG. 8 is a plan view of another example of the pattern portion 500 of FIG. 3. Hereinafter, differences from the pattern portion 500 described above with reference to FIG. 4 will be described.

Referring to FIG. 7, according to an embodiment, a pattern portion 500B includes a plurality of first to third block patterns 511, 513, and 515 that are spaced from one another. For example, the first block pattern 511 is located at the center CP1 of the pattern portion 500B, the pair of second block patterns 513 are located at opposite sides of the first block pattern 511 and spaced apart from the first block pattern 511, and the pair of third block patterns 515 are disposed respectively on outer portions of the pair of second block patterns 513. Here, the first to third block patterns 511, 513, and 515 have widths that gradually decrease from the center CP1 of the pattern portion 500 to outer portions.

In addition, according to an embodiment, block patterns other than the first block pattern 511 include gaps, and the gaps in adjacent block patterns are parallel to each other. For example, the second block pattern 513 includes a plurality of first gaps G1 that divide the second block pattern 513 into a plurality of pieces in a lengthwise direction of the second block pattern 513, and the third block pattern 515 includes a plurality of second gaps G2 that divide the third block pattern 515 into a plurality of pieces in a lengthwise direction of the third block pattern 515. Here, the first gaps G1 and the second gaps G2 are parallel to each other. The above structure provides further openings in the plurality of block patterns at opposite sides of the first block pattern 511, and increases a transmitted amount of the laser beam.

According to an embodiment, a pattern portion 500C of FIG. 8 includes the first block pattern 511 at the center CP1 of the pattern portion 500C and the plurality of block patterns 513 and 515 at outer portions of the first block pattern 511, and a plurality of first and second gaps G1 and G2 in the plurality of block patterns 513 and 515. However, in the pattern portion 500C of FIG. 8, the gaps G1 and G2 are offset in the lengthwise direction from each other to form a zig-zag pattern. For example, the positions of the first gaps G1 in the second block pattern 513 do not correspond with the positions of the second gaps G2 in the third block pattern 515.

Figure 9:
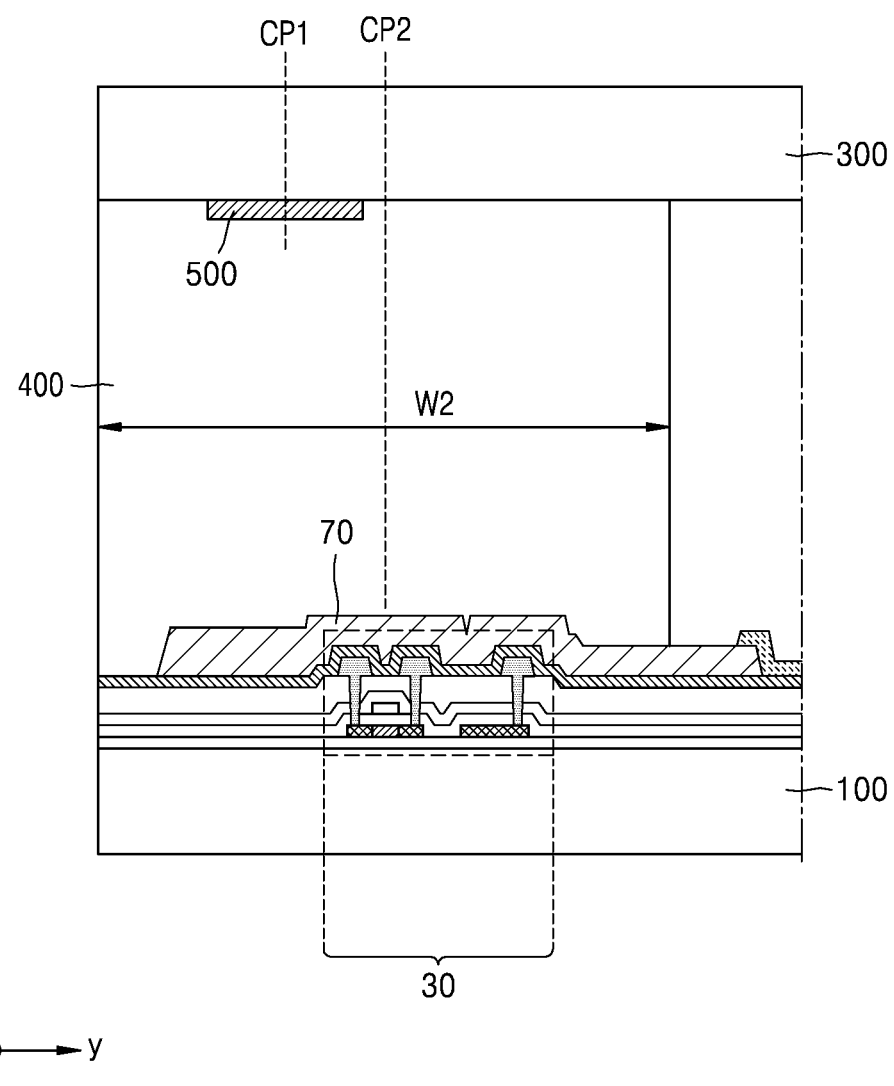
FIG. 9 is a cross-sectional view that partially shows a display apparatus according to an embodiment.

FIG. 9 is a cross-sectional view that partially shows a display apparatus according to an embodiment.

Referring to FIG. 9, according to an embodiment, the substrate 100 and the encapsulation substrate 300 are bonded to each other via the sealing portion 400, and the sealing portion 400 partially overlaps the common power supply line 70. In addition, the first emission driving circuit 30 is disposed under the sealing portion 400. Therefore, the dead area of the display apparatus is reduced.

According to an embodiment, the pattern portion 500 is disposed on the encapsulation substrate 300. The pattern portion 500 may have one of a structure illustrated in FIG. 4, FIG. 7, or FIG. 8. However, the pattern portion 500 is located on a lower surface of the encapsulation substrate 300, where the lower surface faces the substrate 100. In addition, the center CP1 of the width of the pattern portion 500 is located outward from the center CP2 in the width W2 of the sealing portion 400. For example, the pattern portion 500 does not entirely overlap the center CP2 of the width W2 of the sealing portion 400. For example, although the center CP1 of the width of the pattern portion 500 is located outward from the center CP2 of the width W2 of the sealing portion 400, the pattern portion 500 partially overlaps the center CP2 of the width W2 of the sealing portion 400.

According to embodiments of the present disclosure, a display apparatus having a reduced dead area is implemented, which can prevent the generation of defects such as cracks due to a uniform bonding force of the sealing material. However, the scope of embodiments of the disclosure is not limited to the above effects.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus, comprising:
a substrate that includes a display area and a peripheral area around the display area;
an encapsulation substrate on the substrate;
a sealing portion disposed in the peripheral area between the substrate and the encapsulation substrate, wherein the sealing portion surrounds the display area; and
a pattern portion on the encapsulation substrate that overlaps the sealing portion while extending parallel to the sealing portion,
wherein the pattern portion includes a plurality of block patterns that are spaced apart from one another and a plurality of opening regions that alternate with the plurality of block patterns, and
a first block pattern of the plurality of block patterns that has a largest width is located at a center of the pattern portion.

2. The display apparatus of claim 1, wherein the plurality of block patterns and the plurality of opening regions have widths that sequentially decrease from the center of the pattern portion towards an outer portion of the pattern portion.

3. The display apparatus of claim 1, wherein the plurality of block patterns and the plurality of opening regions configure a linear zone plate pattern.

4. The display apparatus of claim 1, wherein an external side surface of the substrate, an external side surface of the encapsulation substrate, and an external surface of the sealing portion are flush with each other.

5. The display apparatus of claim 1, wherein, block patterns of the plurality of block patterns other than the first block pattern include a plurality of gaps that divide the block patterns into a plurality of pieces in a lengthwise direction of the block patterns.

6. The display apparatus of claim 1, further comprising a power supply line between the substrate and the sealing portion,
    wherein the sealing portion covers an external side of the power supply line.
7. The display apparatus of claim 6, wherein
pixels are disposed in the display area of the substrate, an emission driving circuit that transmits an emission control signal to each pixel is disposed in the peripheral area, and
the emission driving circuit is located under the power supply line.
8. The display apparatus of claim 1, wherein the pattern portion is disposed on at least one of an upper surface and a lower surface of the encapsulation substrate.
9. A display apparatus comprising:
    a substrate that includes a display area and a peripheral area around the display area;
    an encapsulation substrate on the substrate;
    a sealing portion disposed on the peripheral area between the substrate and the encapsulation substrate, wherein the sealing portion surrounds the display area; and
    a pattern portion on the encapsulation substrate that overlaps with the sealing portion while extending parallel to the sealing portion,
    wherein the pattern portion includes a plurality of block patterns that are spaced apart from one another and a plurality of opening regions that alternate with the plurality of block patterns, and
    a center of the pattern portion is located outward from a center of the sealing portion.
10. The display apparatus of claim 9, further comprising a power supply line between the substrate and the sealing portion,
    wherein the sealing portion directly contacts the power supply line while partially overlapping the power supply line.
11. The display apparatus of claim 10, wherein
pixels are disposed in the display area of the substrate, an emission driving circuit that transmits an emission control signal to each pixel is disposed in the peripheral area, and
the emission driving circuit is located under the power supply line and a width of the power supply line entirely covers the emission driving circuit.
12. The display apparatus of claim 11, wherein each pixel comprises a pixel circuit that includes a driving thin film transistor, a switching thin film transistor, and a storage capacitor, and an organic light-emitting diode connected to the pixel circuit.

13. The display apparatus of claim 9, wherein a first block pattern of the plurality of block patterns that has a largest width is located at the center of the pattern portion.
14. The display apparatus of claim 13, wherein the plurality of block patterns and the plurality of opening regions configure a linear zone plate pattern.
15. The display apparatus of claim 13, wherein, block patterns of the plurality of block patterns other than the first block pattern include a plurality of gaps that divide the block patterns into a plurality of pieces in a lengthwise direction of the block patterns.
16. The display apparatus of claim 9, wherein the plurality of block patterns and the plurality of opening regions have widths that sequentially decrease from the center of the pattern portion towards an outer portion of the pattern portion.
17. The display apparatus of claim 9, wherein an external side surface of the substrate, an external side surface of the encapsulation substrate, and an external surface of the sealing portion are flush with each other.
18. The display apparatus of claim 9, wherein the pattern portion is disposed on at least one of an upper surface and a lower surface of the encapsulation substrate.
19. A display apparatus, comprising:
    a substrate that includes a display area and a peripheral area around the display area;
    an encapsulation substrate on the substrate;
    a sealing portion disposed in the peripheral area between the substrate and the encapsulation substrate, wherein the sealing portion surrounds the display area; and
    a pattern portion on the encapsulation substrate that overlaps the sealing portion while extending parallel to the sealing portion,
    wherein the pattern portion includes a plurality of block patterns that are spaced apart from one another and a plurality of opening regions that alternate with the plurality of block patterns, and
    widths of the plurality of block patterns and widths of the plurality of opening regions sequentially decrease from the center of the pattern portion towards an outer portion of the pattern portion.
20. The display apparatus of claim 19, wherein block patterns of the plurality of block patterns other than a centermost block pattern include a plurality of gaps that divide the block patterns into a plurality of pieces in a lengthwise direction of the block patterns.

* * * * *